(12) United States Patent
Kobayashi et al.

(10) Patent No.: US 10,991,581 B2
(45) Date of Patent: Apr. 27, 2021

(54) METHOD FOR MANUFACTURING SEMICONDUCTOR FILM

(71) Applicant: THE JAPAN STEEL WORKS, LTD., Tokyo (JP)

(72) Inventors: Naoyuki Kobayashi, Tokyo (JP); Hiroaki Imamura, Tokyo (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 0 days.

(21) Appl. No.: 16/805,767

(22) Filed: Feb. 29, 2020

(65) Prior Publication Data
US 2020/0343090 A1   Oct. 29, 2020

(30) Foreign Application Priority Data

Apr. 26, 2019  (JP) .............................. JP2019-084976

(51) Int. Cl.
*H01L 21/02*   (2006.01)
*H01L 29/66*   (2006.01)

(52) U.S. Cl.
CPC .. *H01L 21/02686* (2013.01); *H01L 29/66765* (2013.01); *H01L 21/02532* (2013.01); *H01L 21/02592* (2013.01)

(58) Field of Classification Search
CPC ......... H01L 21/02686; H01L 29/66765; H01L 21/02532; H01L 21/02592; H01L 21/324; H01L 21/67115; H01L 21/268; H01L 21/2026; H01L 21/3225
USPC ............................................. 438/96, 97, 795
See application file for complete search history.

(56) References Cited

U.S. PATENT DOCUMENTS

| | | | | |
|---|---|---|---|---|
| 2003/0215973 | A1* | 11/2003 | Yamazaki | H01L 21/0237 438/48 |
| 2005/0189542 | A1* | 9/2005 | Kudo | H01L 21/2026 257/64 |
| 2019/0363504 | A1* | 11/2019 | Onose | H01S 3/0092 |

FOREIGN PATENT DOCUMENTS

JP   2017-224708 A   12/2017

OTHER PUBLICATIONS

Translation of claims of priority doc. JP 2019-084976, total p. 4.*

* cited by examiner

*Primary Examiner* — Bo B Jang
(74) *Attorney, Agent, or Firm* — SGPatents PLLC

(57) ABSTRACT

A method for manufacturing a semiconductor film capable of forming a semiconductor film with high crystalline quality using a solid-state laser is provided. A method for manufacturing a semiconductor film according to the present disclosure includes the steps of (a) irradiating an amorphous semiconductor film with a first pulsed laser beam emitted from a solid-state laser, and then after the step (a), (b) irradiating the semiconductor film with a second pulsed laser beam including intensity lower than that of the first pulsed laser beam.

17 Claims, 18 Drawing Sheets

METHOD FOR MANUFACTURING SEMICONDUCTOR FILM

This application is based upon and claims the benefit of priority from Japanese patent application No. 2019-084976, filed on Apr. 26, 2019, the disclosure of which is incorporated herein in its entirety by reference.

BACKGROUND

The present disclosure relates to a method for manufacturing a semiconductor film.

A laser annealing method is known as a method for manufacturing a semiconductor film of a Thin Film Transistor (TFT) used for a screen of a display such as a liquid crystal display or an organic EL (Electro Luminescence) display. In the laser annealing method, an amorphous semiconductor film formed over a substrate is irradiated with a laser beam to be crystallized, so that a polycrystalline semiconductor film is formed.

An Excimer Laser Anneal (hereinafter referred to as an ELA) apparatus that generates a laser beam using a mixed gas such as a rare gas and halogen is known as a laser annealing apparatus used in the laser annealing method. Use of the ELA apparatus is widespread, because the ELA apparatus can obtain crystal grains with a substantially uniform size, i.e., high crystalline quality, when an amorphous semiconductor film is crystallized. Hereinafter, high crystalline quality of a crystallized semiconductor film means that crystal grains are substantially uniform in size.

However, the ELA apparatus has a problem that running cost is high. A solid-state laser using a solid material is known as a laser other than an excimer laser. The running cost of a laser annealing apparatus using a solid-state laser is lower than that of an ELA apparatus. However, a laser annealing apparatus using a solid-state laser has a problem that a semiconductor film with high crystalline quality cannot be formed stably as compared with that formed by an ELA apparatus.

Japanese Unexamined Patent Application Publication No. 2017-224708 discloses a method for manufacturing a semiconductor film for forming a semiconductor film with high crystalline quality using a solid-state laser. According to the manufacturing method disclosed in Japanese Unexamined Patent Application Publication No. 2017-224708, first, a semiconductor film is irradiated with a first laser beam emitted from a solid-state laser. After that, the semiconductor film is irradiated with a second laser beam having the same intensity as that of the first laser beam.

SUMMARY

However, the present inventors have found through studies that forming a semiconductor film with high crystalline quality could be further improved using a solid-state laser.

Other problems and novel features will be apparent from the description of the present specification and the attached drawings.

An example aspect of the present disclosure is a method for manufacturing a semiconductor film including a step of irradiating an amorphous semiconductor film with a first pulsed laser beam emitted from a solid-state laser, and a step of, after the above step, irradiating the semiconductor film with a second pulsed laser beam emitted from a solid-state laser and including intensity lower than that of the first pulsed laser beam.

According to the above example aspect, it is possible to provide a method for manufacturing a semiconductor film capable of forming a semiconductor film with high crystalline quality using a solid-state laser.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Hereinafter, specific embodiments of the present disclosure will be described in detail with reference to the drawings. However, the present disclosure is not limited to the following embodiments. In addition, the following description and drawings are simplified as appropriate for clarity of descriptions. The same elements are denoted by the same reference signs throughout the drawings, and repeated description is omitted as necessary.

<Excimer Laser and Solid-State Laser>

Prior to describing the embodiments of the present disclosure, an excimer laser and a solid-state laser will be described in comparison with each other.

Polarization State of Laser Beam

The polarization state of a laser beam emitted from an excimer laser is random polarized light (non-polarized light).

On the other hand, the polarization state of a laser beam emitted from a solid-state laser is linearly polarized light.

Pulse Waveform of Laser Beam

Figure 1:
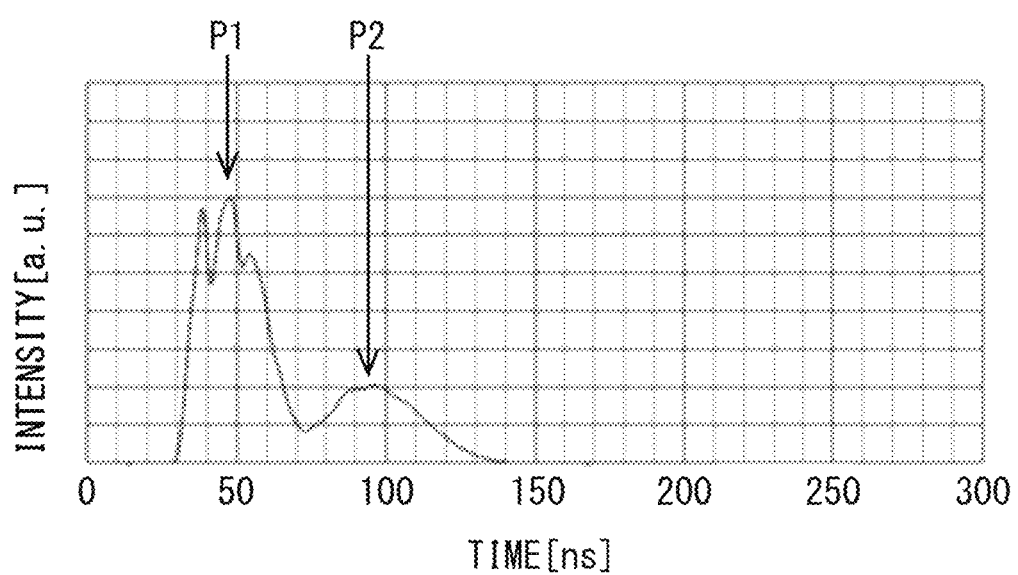
FIG. 1 shows an example of a pulse waveform of a laser beam emitted from an excimer laser.
Figure 2:
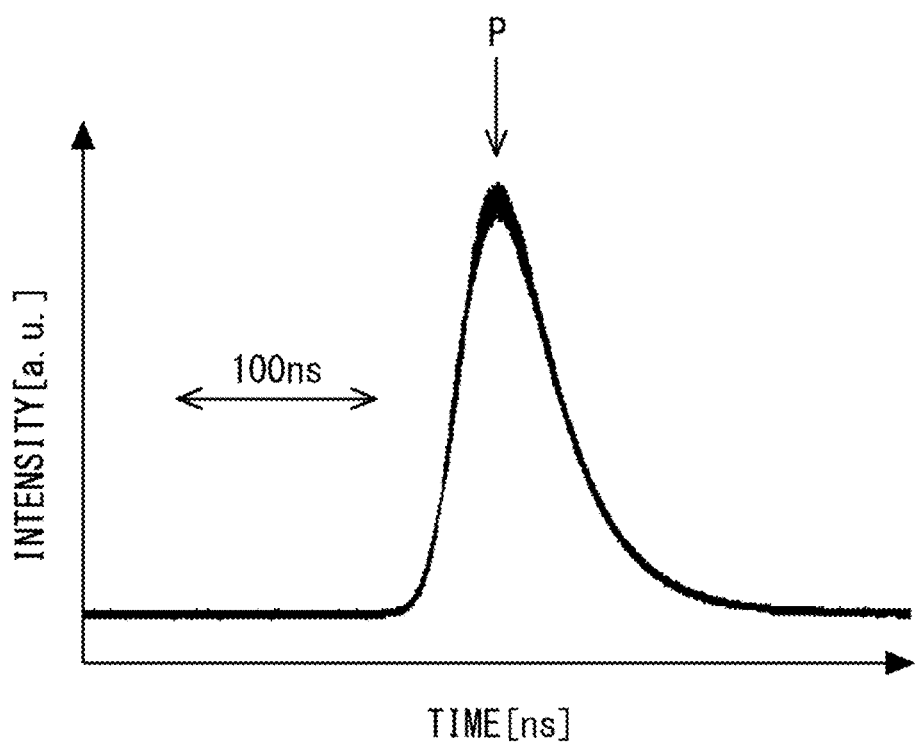
FIG. 2 shows an example of a pulse waveform of a laser beam emitted from a solid-state laser.

FIG. 1 shows an example of a pulse waveform of a laser beam emitted from an excimer laser. FIG. 2 shows an example of a pulse waveform of a laser beam emitted from a solid-state laser. In FIGS. 1 and 2, the horizontal axis represents time, and the vertical axis represents intensity.

As shown in FIG. 1, the pulse waveform of the laser beam emitted from the excimer laser has two peaks P1 and P2 appearing consecutively. The pulse waveform is such that the peak P2 that appears secondly has intensity lower than that of the peak P1 that appears first. This pulse waveform is a pulse waveform unique to an excimer laser.

On the other hand, as shown in FIG. 2, the pulse waveform of the laser beam emitted from the solid-state laser has only one peak P appears.

Surface Condition of Polysilicon Film

Next, a surface state of a polysilicon film (p-Si film) obtained by irradiating an amorphous silicon film (a-Si film) formed over a substrate with a laser beam composed of a line beam using an excimer laser or a solid-state laser to crystallize the film will be described.

Figure 3:
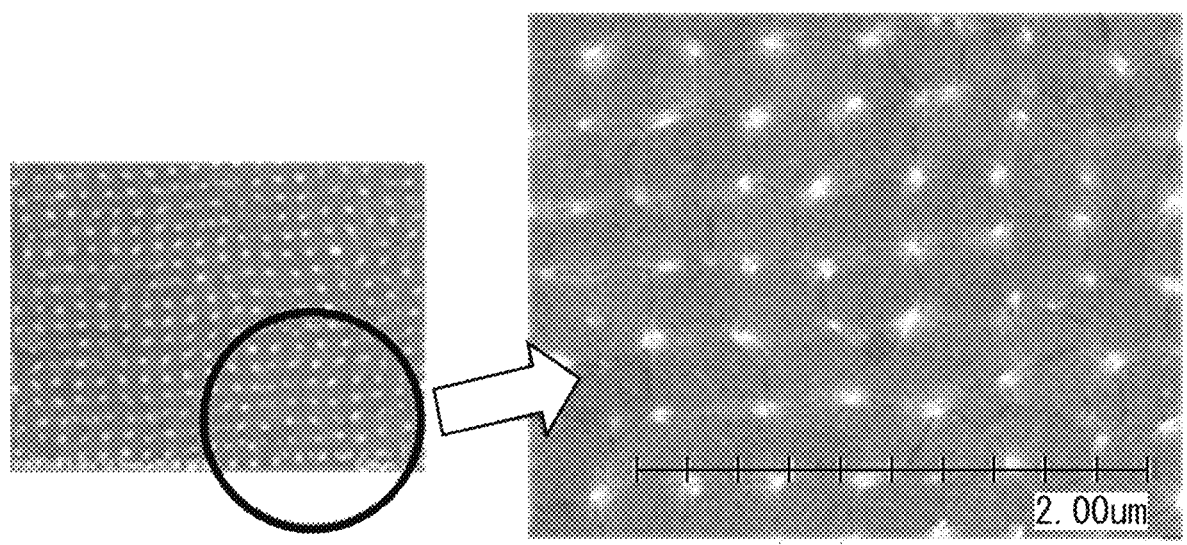
FIG. 3 shows an example of an SEM photograph of a surface of a polysilicon film manufactured using an excimer laser.
Figure 4:
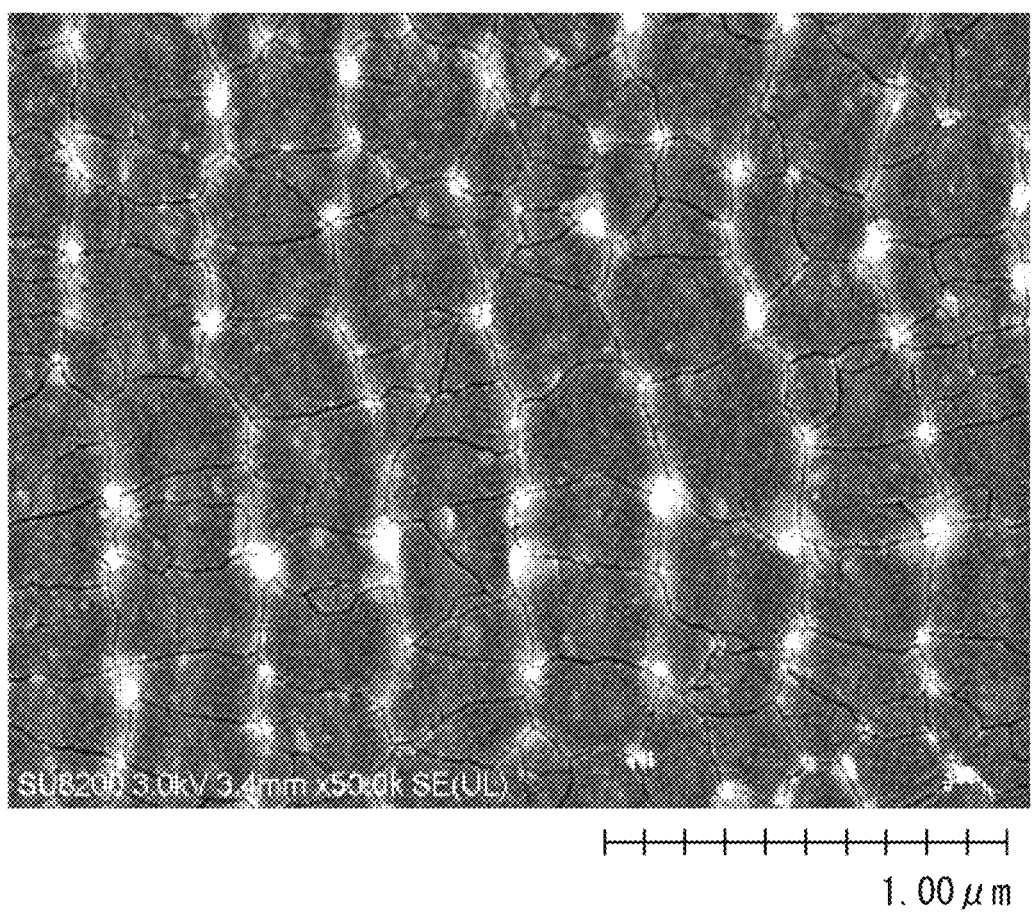
FIG. 4 shows an example of an SEM photograph of a surface of a polysilicon film manufactured using a solid-state laser.

FIG. 3 shows an example of an SEM (Scanning Electron Microscope) photograph of a surface of a polysilicon film manufactured using an excimer laser. FIG. 4 shows an example of an SEM photograph of a surface of a polysilicon film manufactured using a solid-state laser. In FIGS. 3 and 4, parts that look whitish correspond to projections projecting from the surface, and black lines in the gaps between the projections correspond to grain boundaries that are boundaries between crystal grains.

As shown in FIG. 3, it can be seen that in the polysilicon film manufactured using an excimer laser, projections are arranged at substantially equal intervals, crystal grains are substantially uniform in size, and crystal grains are arranged with regularity. This means that high crystalline quality is achieved.

On the other hand, as shown in FIG. 4, it can be seen that in the polysilicon film manufactured using a solid-state laser, as compared with the polysilicon film manufactured using the excimer laser, the projections are arranged irregularly, and there are many grain boundaries in the gaps between the projections. This means that high crystalline quality is not achieved. Such a polysilicon film is not suitable for a thin film transistor such as a liquid crystal display.

Maintainability and Running Cost

An excimer laser requires regular gas exchange about once every few days, because it uses a mixed gas such as a rare gas and halogen. Such a mixed gas is expensive. For this reason, the excimer laser has problems that maintainability is poor and running cost is high.

On the other hand, a solid-state laser does not require gas exchange, because it does not need to use a mixed gas, unlike the excimer laser. The solid-state laser thus has an advantage, as compared with the excimer laser, that maintainability is good and running cost is low.

As described above, the excimer laser has an advantage that a semiconductor film with high crystalline quality can be formed stably, but also has a problem that maintainability is poor and running cost is high.

On the other hand, the solid-state laser has advantages that maintainability is good and running cost is low, but also has a problem that a semiconductor film with high crystalline quality cannot be formed stably.

<Pulse Waveform of Excimer Laser Beam>

The present inventors have found that a pulse waveform unique to an excimer laser, in which two peaks P1 and P2 consecutively appear, and the intensity of the second peak P2 is lower than that of the first peak P1, greatly contributes to achieving high crystalline quality of a crystallized semiconductor film. The reason for this will be described below.

Figure 5A:
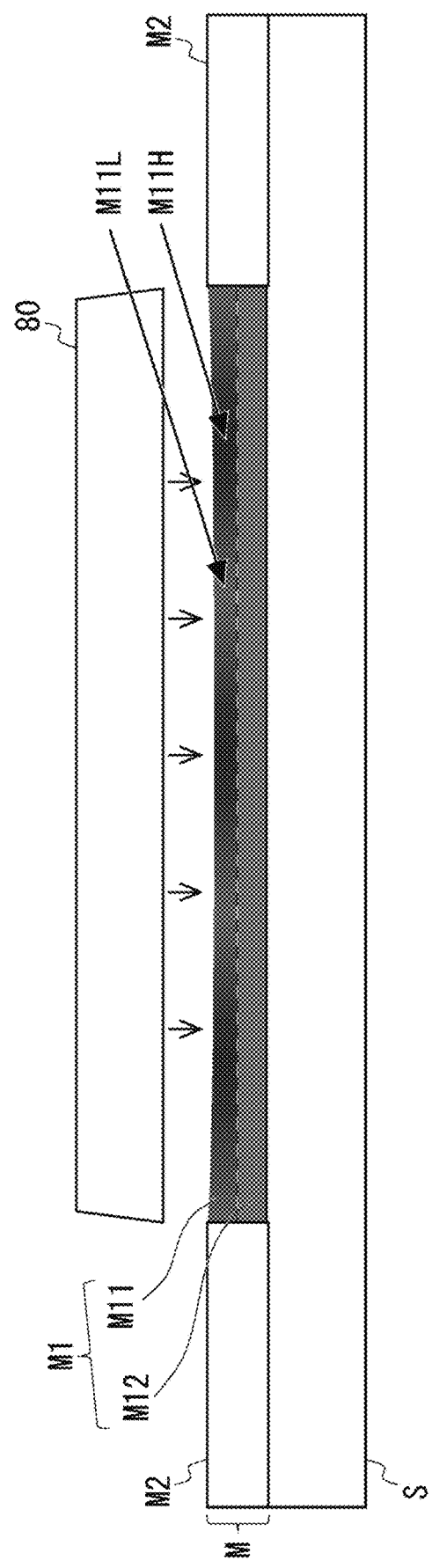
FIG. 5A is a cross-sectional view for describing an example of a state of a semiconductor film during laser annealing processing using an excimer laser.
Figure 5B:
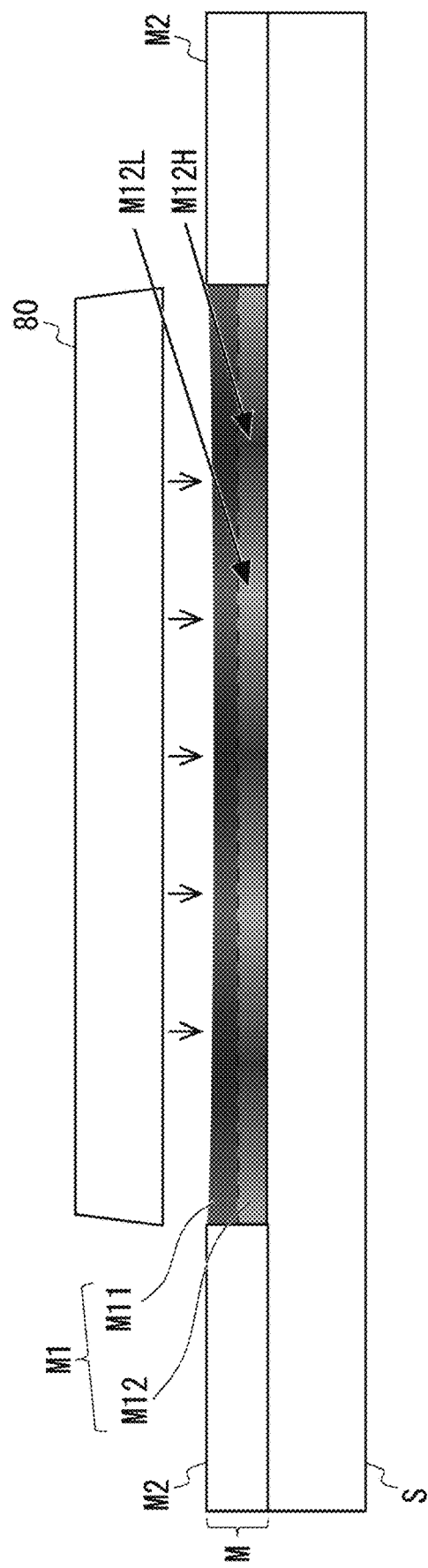
FIG. 5B is a cross-sectional view for describing an example of a state of a semiconductor film during laser annealing processing using an excimer laser.

FIGS. 5A and 5B are cross-sectional views showing an example of a state of a semiconductor film M during laser annealing processing using an excimer laser 80. In the example of FIGS. 5A and 5B, the semiconductor film M is a silicon film. In manufacturing of the semiconductor film M, the semiconductor film M formed over a substrate S is irradiated with a laser beam composed of a line beam from the excimer laser 80, and an amorphous silicon film is crystallized to form a polysilicon film. In FIGS. 5A and 5B, for convenience, a part of the semiconductor film M irradiated with the laser beam from the excimer laser 80 is referred to as an irradiated part M1, and a part of the semiconductor film M not irradiated with the laser beam from the excimer laser 80 is referred to as a non-irradiated part M2. Further, a part of the irradiated part M1 melted by the irradiation of the laser beam is referred to as a melted part M11, and a part of the irradiated part M1 not melted by the irradiation of the laser beam is referred to as a solid phase part M12. A high temperature part of the melted part M11 is referred to as a high temperature part M11H, a low temperature part of the melted part M11 is referred to as a low temperature part M11L, and a high temperature part of the solid phase part M12 is referred to as a high temperature part M12H, and a low temperature part of the solid phase part M12 is referred to as a low temperature part M12L.

As shown in FIG. 5A, when the irradiated part M1 of the semiconductor film M is irradiated with the laser beam from the excimer laser 80, and an upper layer part of the irradiated part M1 is melted to become the melted part M11. Surface plasmons are generated over the surface of the melted part M11.

At this time, a standing wave is generated in the melted part M11, and a temperature distribution in which the high temperature part M11H and the low temperature part M11L periodically appear in the horizontal direction (film surface direction) is formed.

When the state shown in FIG. 5A is maintained, as shown in FIG. 5B the periodic temperature distribution of the melted part M11 is reflected to the solid phase part M12, a temperature distribution in which the high temperature part M12H and the low temperature part M12L periodically appear in the horizontal direction is formed also in the solid phase part M12.

Then, the solid phase part M12 becomes a nucleus, and crystals grow from the low temperature part M12L toward the high temperature part M12H with the nucleus as a starting point. As a result of such a solid phase growth process, the crystallized semiconductor film M has substantially uniform crystal grain size and high crystalline quality.

Thus, it is necessary to ensure an enough time for growing crystals in the solid phase part M12 in order to form the semiconductor film M with high crystalline quality. In order to do so, as shown in FIGS. 5A and 5B, it is important to maintain a state in which a melting depth of the semiconductor film M does not reach an interface between the irradiated part M1 and the substrate S, and only the melted part M11 in the upper layer part of the irradiated part M1 is melted, i.e., the state in which the irradiated part M1 of the semiconductor film M is not completely melted, for a certain period of time.

Here, as described with reference to FIG. 1, the pulse waveform of the laser beam emitted from the excimer laser 80 has two peaks P1 and P2 appearing consecutively, and the intensity of the second peak P2 is lower than that of the first peak P1.

When the laser beam of the excimer laser 80 is applied to the irradiated part M1 of the semiconductor film M, first, the first peak P1 of the laser beam is applied to the irradiated part M1, and the temperature of the upper layer part of the irradiated part M1 gradually increases. When the temperature of the upper layer part of the irradiated part M1 becomes the melting point or higher, the upper layer part of the irradiated part M1 is melted to form the melted part M11.

After that, the temperature of the melted part M11 decreases. When the temperature of the melted part M11 decreases to a freezing point and the melted part M11 is solidified, the irradiated part M1 is not uniformly heated by the irradiation of the second peak P2. This may cause the size of the crystal grains to be inconsistent. In such a case, a delay time from when the peak P1 is applied until the peak P2 is applied is considered to be such a delay time that the peak P2 is applied before the melted part M11 melted by the irradiation of the peak P1 is solidified.

However, when the peak P2 is applied before the melted part M11 is solidified, the temperature of the melted part M1 at that point does not decrease to the freezing point, and maintains at a high temperature. Therefore, if the peak P2 has the same intensity as that of the first peak P1, the irradiation of the peak P2 may cause the melting of the irradiated part M1 to proceed, and the irradiated part M1 may be completely melted.

However, as described with reference to FIG. 1, the intensity of the peak P2 of the laser beam of the excimer laser 80 is lower than the intensity of the first peak P1. For this reason, the irradiated part M1 is not completely melted even by the irradiation of the peak P2, and the state in which only the upper layer part of the irradiated part M1 is melted is maintained, as shown in FIGS. 5A and 5B. As a result, it is considered that the semiconductor film M manufactured using the excimer laser 80 has substantially uniform crystal grain size and high crystalline quality.

First Embodiment

<Method for Manufacturing Semiconductor Film According to First Embodiment>

As described above, a pulse waveform of a laser beam unique to an excimer laser, in which two peaks P1 and P2 consecutively appear, and the intensity of the second peak P2 is lower than that of the first peak P1, greatly contributes to high crystalline quality of the semiconductor film M manufactured using an excimer laser.

However, a solid-state laser is more advantageous than an excimer laser in terms of maintainability and running cost.

A method for manufacturing the semiconductor film M according to the first embodiment is based on the above findings. The method for manufacturing the semiconductor film M according to the first embodiment uses a solid-state laser that is advantageous in terms of maintainability and running cost, and reproduces the pulse waveform unique to an excimer laser in order to achieve high crystalline quality of the semiconductor film, improve maintainability, and lower the running cost.

Figure 6:
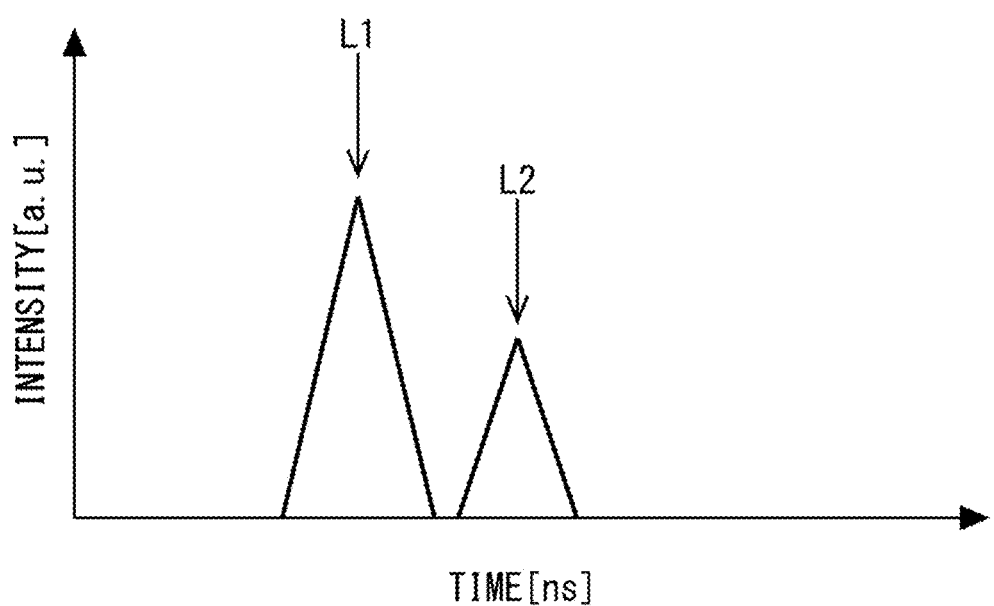
FIG. 6 shows an example of a pulse waveform of a laser beam used in the method for manufacturing a semiconductor film according to a first embodiment.

FIG. 6 shows an example of a pulse waveform of a laser beam used in the method for manufacturing the semiconductor film M according to the first embodiment. In FIG. 6, the horizontal axis represents time, and the vertical axis represents intensity.

As shown in FIG. 6, in the method for manufacturing the semiconductor film M according to the first embodiment, two pulsed laser beams L1 and L2 emitted from a solid-state laser are multiplexed so that they become a pulse waveform similar to the pulse waveform (FIG. 1) of the laser beam unique to the excimer laser. That is, the laser beams are multiplexed in such a way that two pulsed laser beams L1 and L2 become continuous, and the intensity of the second laser beam L2 becomes lower than that of the first laser beam L1.

Figure 7:
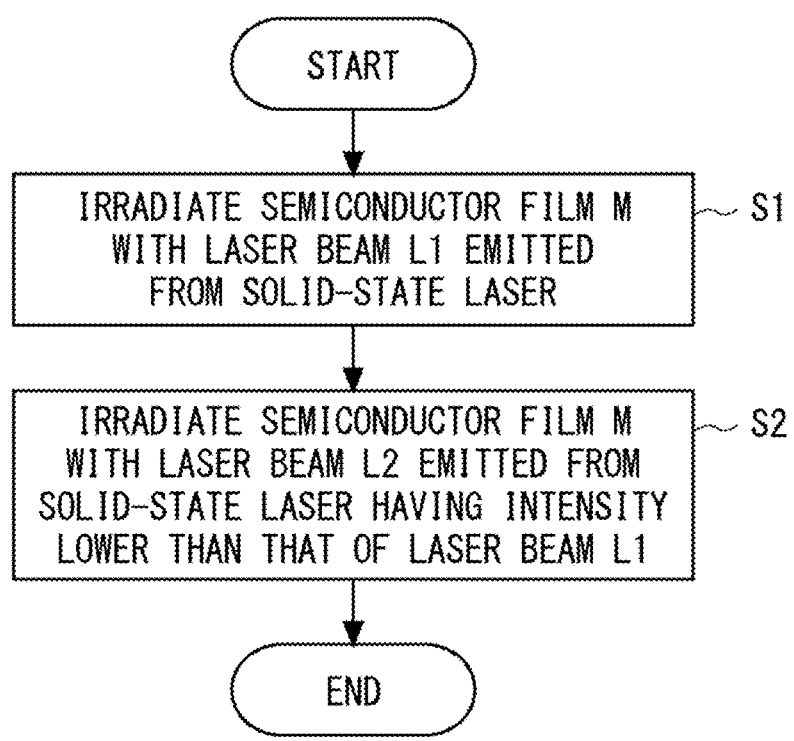
FIG. 7 is a flowchart showing an example of the method for manufacturing a semiconductor film according to the first embodiment.

FIG. 7 is a flowchart showing an example of the method for manufacturing the semiconductor film M according to the first embodiment.

As shown in FIG. 7, first, the amorphous semiconductor film M is irradiated with the pulsed laser beam L1 emitted from the solid-state laser (Step S1). Next, after the above semiconductor film M is irradiated with the laser beam L1, it is irradiated with the pulsed laser beam L2 which is emitted from the solid-state laser and has intensity lower than that of the laser beam L1 (Step S2). Then, a pulse waveform similar to the pulse waveform (FIG. 1) of the laser beam unique to the excimer laser as shown in FIG. 6 is reproduced.

Thus, the semiconductor film M manufactured by the manufacturing method according to the first embodiment is not completely melted even when irradiated with the laser beam L2 subsequent to the irradiation with the laser beam L1, and as shown in FIGS. 5A and 5B, the state in which only the upper layer part of the semiconductor film M is melted is maintained for a certain time. As a result, the semiconductor film M having uniform crystal grain size and high crystalline quality can be formed.

Additionally, since a solid-state laser is used in the method for manufacturing the semiconductor film M according to the first embodiment, maintainability is improved, and running cost can be reduced.

The semiconductor film M is not limited to the above-described silicon film and instead may be, for example, a germanium film.

The solid-state laser may be, for example, a YAG (Yttrium Aluminum Garnet) laser or a YVO (Yttrium Vanadium Oxide) laser.

The solid-state laser serving as a laser light source of the laser beams L1 and L2 may be separate solid-state lasers for the laser beams L1 and L2 or a single solid-state laser for both of the laser beams L1 and L2.

The polarization states of the laser beams L1 and L2 emitted from the solid-state laser are linearly polarized light. However, one or both of the laser beams L1 and L2 may be orthogonal linearly polarized light. Alternatively, the semiconductor film M may be irradiated with the laser beams L1 and L2 after the laser beams L1 and L2 are converted from linearly polarized light into circularly polarized light. As a method for converting linearly polarized light into circularly polarized light, any well-known method such as the method of using a polarizing mirror may be used.

Further, a method for making intensity of the laser beam L1 differ from that of the laser beam L2 may be any method. For example, the difference between the intensity of the laser beam L1 and that of the laser beam L2 may be created by making the transmittance of a reflection mirror disposed over the optical path of one of the laser beams L1 and L2 different from the transmittance of a reflection mirror disposed over the optical path of the other one of the laser beams L1 and L2. Alternatively, the difference between the intensity of the laser beam L1 and that of the laser beam L2 may be created by disposing an attenuator over the optical path of each of the laser beam L1 and the laser beam L2. Further alternatively, the difference between the intensity of the laser beam L1 and that of the laser beam L2 may be created by using different solid-state lasers with intensity different from each other for the laser beams L1 and L2.

The irradiation with the laser beam L2 may be performed after a predetermined delay time has elapsed from the irradiation with the laser beam L1. The delay time at this time is preferably defined in such a way that the semiconductor film M is irradiated with the laser beam L2 before the semiconductor film M melted by the irradiation of the laser beam L1 is solidified. By avoiding the solidification of the semiconductor film M in this manner, the semiconductor film M is uniformly heated by the irradiation of the laser beam L2, thereby contributing to high crystalline quality of the semiconductor film M.

Figure 8:
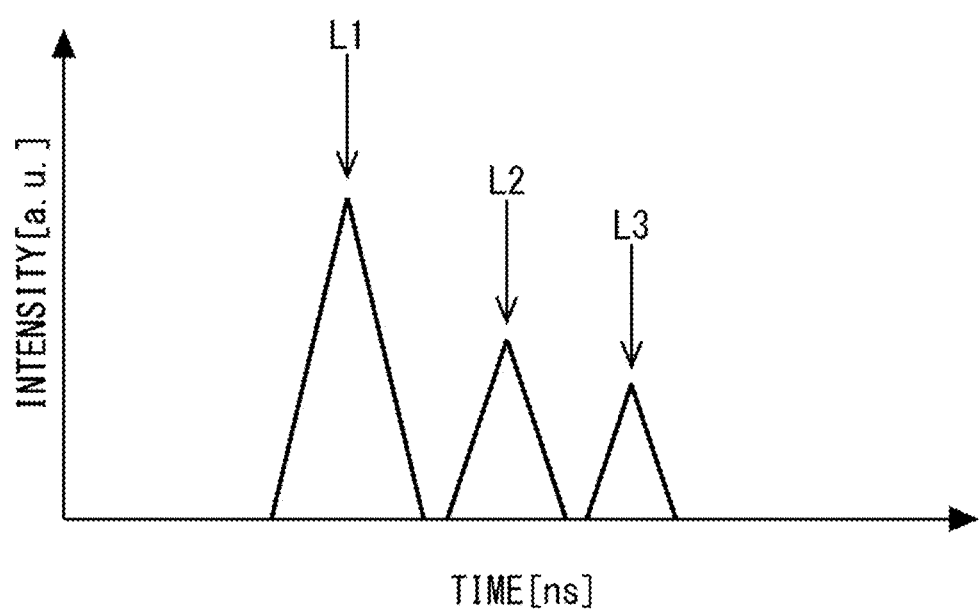
FIG. 8 shows another example of the pulse waveform of the laser beam used in the method for manufacturing a semiconductor film according to the first embodiment.
Figure 9:
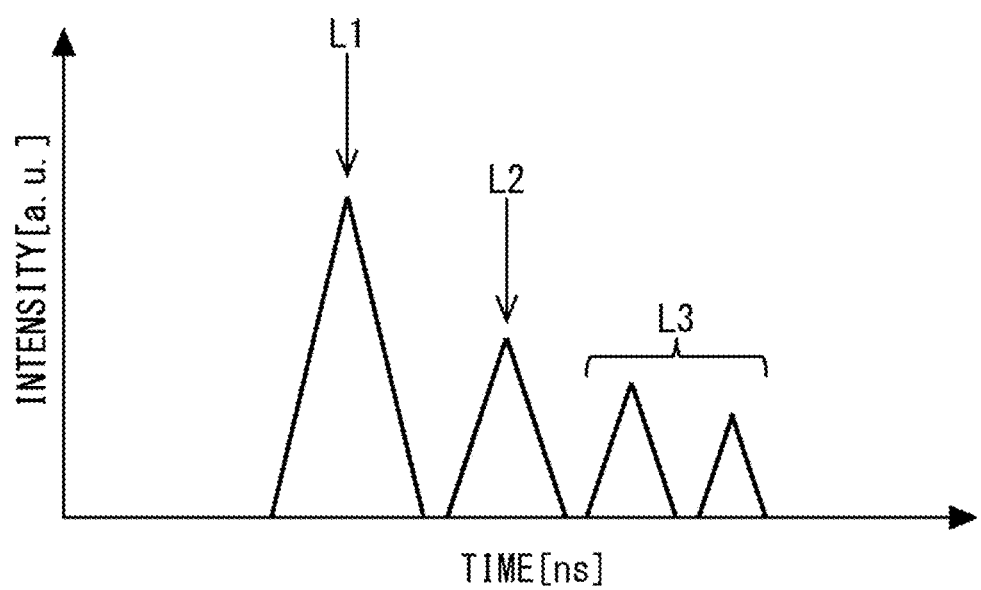
FIG. 9 shows yet another example of the pulse waveform of the laser beam used in the method for manufacturing a semiconductor film according to the first embodiment.

The laser beam applied to the semiconductor film M is not limited to the two laser beams L1 and L2 and instead may be three or more laser beams. After the laser beam L2 is applied, a laser beam(s) other than the laser beams L1 and L2 may be applied from the solid-state laser. FIG. 8 shows an example in which a single pulsed laser beam L3 is applied after the irradiation of the laser beam L2. FIG. 9 shows an example in which a plurality of pulsed laser beams L3 (two laser beams L3 in FIG. 9) are applied after the irradiation with the laser beam L2. In FIGS. 8 and 9, the intensity of the laser beam L3 is lower than the intensity of the laser beam L2, and in FIG. 9, the intensity of the plurality of laser beams L3 becomes gradually lower. However, the present disclosure is not limited to such cases. The intensity of the laser beam L3 only needs to be lower than that of the laser beam L1.

Second Embodiment

<Laser Processing Apparatus According to Second Embodiment>

Next, as a second embodiment, a laser processing apparatus 1 used in the above-described method for manufacturing the semiconductor film M according to the first embodiment will be described. Note that the laser processing apparatus 1 is configured to multiplex two laser beams L1 and L2 (the same applies to a laser processing apparatus 101 in FIG. 12 and a laser processing apparatus 201 in FIG. 13 described below).

Figure 10:
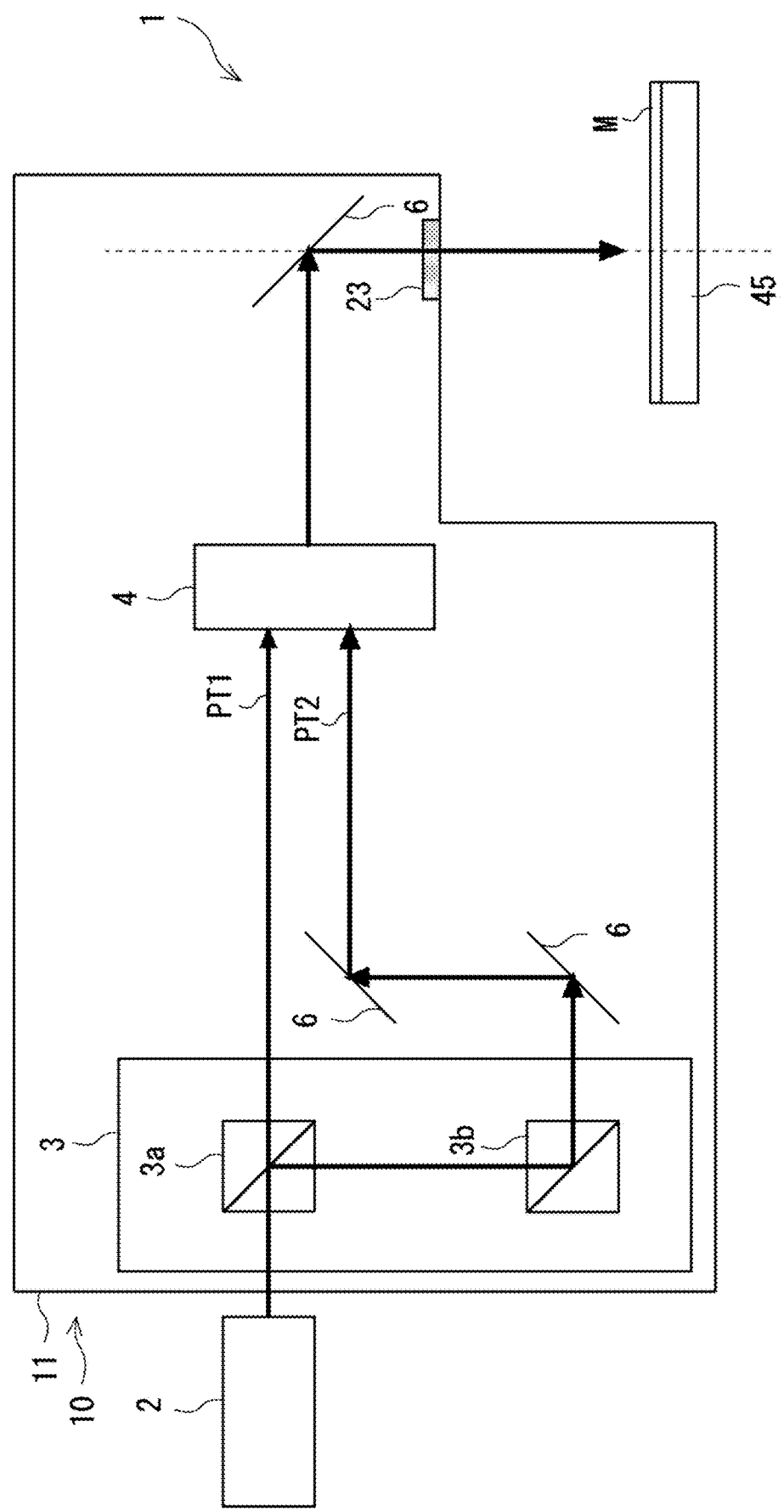
FIG. 10 shows a configuration example of a laser processing apparatus according to a second embodiment.

FIG. 10 shows a configuration example of the laser processing apparatus 1 according to the second embodiment. The laser processing apparatus 1 is an apparatus for irradiating the semiconductor film M formed over a substrate with laser beams to crystallize the semiconductor film M. Here, in manufacturing of the semiconductor film M, the semiconductor film M is irradiated with a laser beam composed of a line beam, and an amorphous silicon film is crystallized to form a polysilicon film. As shown in FIG. 10, the laser processing apparatus 1 includes a solid-state laser 2 and an optical system module 10.

The solid-state laser 2 is a laser light source that generates pulsed laser beams by a pulse oscillation operation. The optical system module 10 includes an optical system casing 11 that constitutes an outer shape, optical elements such as a partial reflection mirror 3, reflection mirrors 6, and a homogenizer 4, and a sealing window 23. Laser beams generated by the solid-state laser 2 are guided to the partial reflection mirror 3 of the optical system module 10. The partial reflection mirror 3 is composed of a first partial reflection mirror 3a and a second partial reflection mirror 3b. The first partial reflection mirror 3a and the second partial reflection mirror 3b are optical apparatuses configured to be able to change the transmittance, i.e., to be able to transmit some of the incident laser beams and reflect the rest. The partial reflection mirror 3 has a role of adjusting the timing at which the semiconductor film M is irradiated with a laser beam and adjusting the intensity of the laser beam.

A laser beam emitted from the solid-state laser 2 is first guided to the first partial reflection mirror 3a. The laser beam transmitted through the first partial reflection mirror 3a is guided to the homogenizer 4. The homogenizer 4 is composed of a plurality of cylindrical lenses and makes the intensity distribution uniform in a rectangular shape. On the other hand, the laser beam reflected by the first partial reflection mirror 3a is reflected by the second partial reflection mirror 3b, a direction of the laser beam is changed by the plurality of reflection mirrors 6, and the laser beam is guided to the homogenizer 4.

There is a difference between a length of a first optical path PT1 and a length of a second optical path PT2. The first optical path PT1 is an optical path that guides a light beam transmitted through the first partial reflection mirror 3a to the homogenizer 4, while the second optical path PT2 is an optical path that guides a light beam reflected by the second partial reflection mirror 3b to the homogenizer 4. The second optical path PT2 is longer than the first optical path PT1 (second optical path PT2>first optical path PT1). Thus, when a laser beam is emitted once from the solid-state laser 2, the laser beam (corresponding to the above-described laser beam L1) first reaches the semiconductor film M through the first optical path PT1. Next, the laser beam (corresponding to the above-described laser beam L2) reaches the semiconductor film M through the second optical path PT2. In this manner, the time interval (irradiation interval) at which the semiconductor film M is irradiated with the laser beams can be changed by making the length of the optical path variable.

Further, the intensity of the laser beam can be changed by changing the transmittance of the partial reflection mirror 3. That is, by changing the transmittance of the first partial reflection mirror 3a, the intensity of the laser beam (corresponding to the above-described laser beam L1) through the first optical path PT1 and the intensity the laser beam (corresponding to the above-described laser beam L2) through the second optical path PT2 can be changed.

The semiconductor film M is disposed over a substrate stage 45 in a state in which the semiconductor film M is formed over a substrate (not shown).

Figure 11:
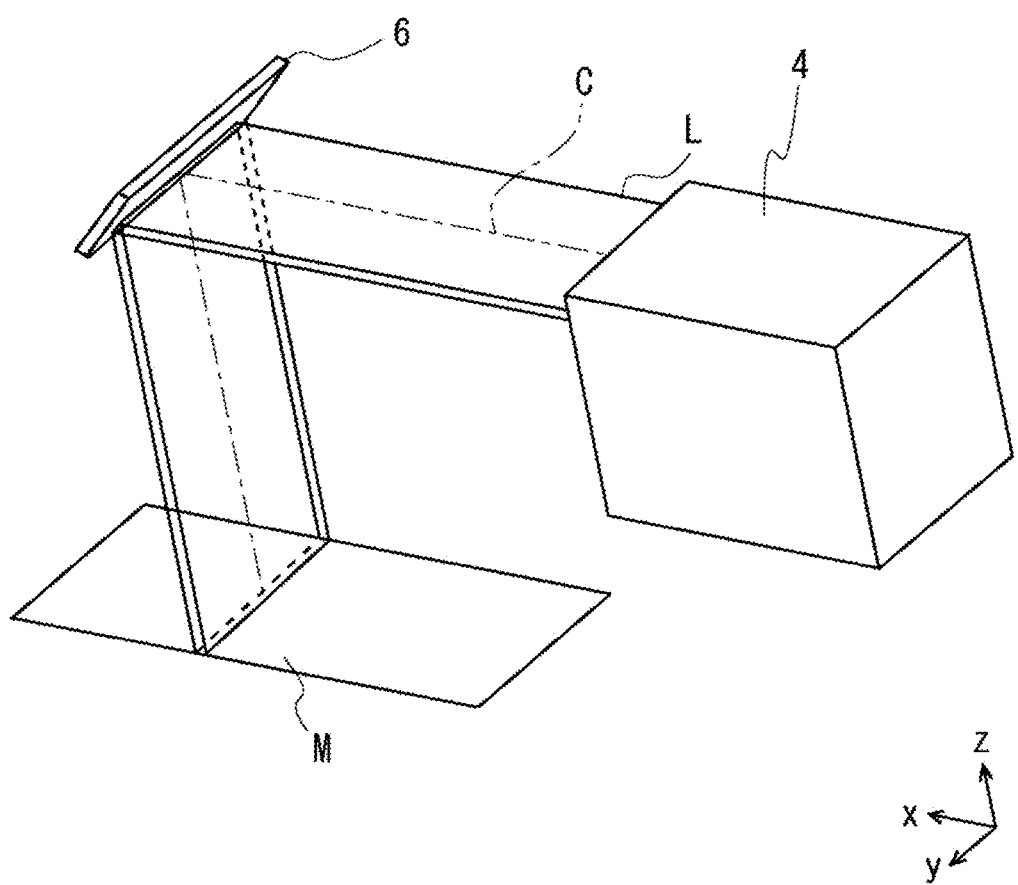
FIG. 11 is a schematic diagram for describing an example of a laser beam applied to a semiconductor film in the laser processing apparatus according to the second embodiment.

FIG. 11 is a schematic diagram for describing an example of a laser beam applied to the semiconductor film M. As shown in FIG. 11, a laser beam L becomes a line beam after passing through the homogenizer 4. That is, a cross section of the laser beam L orthogonal to an optical axis C is an elongated linear shape extending in one direction. For example, a cross section of the laser beam L orthogonal to the optical axis reflected by the reflection mirror 6 is a linear shape extending in the Y-axis direction. In order to crystallize the entire surface of the amorphous silicon film over the semiconductor film M, the semiconductor film M is moved along the short axis direction (X-axis direction) of the line beam intermittently at a feed pitch of 5 to 10% of the short axis width of the line beam in one shot of the line beam. For example, when the short axis width is 0.4 mm, the feed pitch is 20 to 40 and the number of times of the amorphous silicon film is irradiated with laser beams per location is 10 to 20 times.

When the solid-state laser 2 emits a laser beam once, the semiconductor film M is irradiated with a laser beam twice at different timings. For example, when the solid-state laser 2 emits a laser beam seven times, the semiconductor film M is irradiated with the laser beams 14 times at different timings. The semiconductor film M is irradiated with the laser beams that have passed through the optical paths having different lengths, in accordance with the order of the respective lengths of the optical paths. That is, the semiconductor film M is irradiated firstly with the laser beam (corresponding to the above-described laser beam L1) through the first optical path PT1 having an optical path length shorter than that of the second optical path PT2. Then, the semiconductor film M is secondly irradiated with the laser beam (corresponding to the above-described laser beam L2) through the second optical path PT2.

Here, when a laser beam having energy density E0 is emitted once from the solid-state laser 2, the energy density of the laser beam (corresponding to the above-described laser beam L1) that reaches the semiconductor film M first is defined as E1, and the energy density of the laser beam (corresponding to the above-mentioned laser beam L2) that reaches the semiconductor film M second is defined as E2. The reflectance of the first partial reflection mirror 3a is defined as R1, the transmittance of the first partial reflection mirror 3a is defined as T1, and the reflectance of the second partial reflection mirror 3b is defined as R2. Then, E1 and E2 are respectively expressed by the following formulas.

$$E1 = T1 \cdot E0$$

$$E2 = (R1 \cdot R2) \cdot (E0)$$

From the above formulas, a ratio r of the energy density E2 of the laser beam (corresponding to the above-described laser beam L2) that reaches the semiconductor film M second to the energy density E1 of the laser beam (corresponding to the above-described laser beam L1) of the laser beam that reaches the semiconductor film M first is $r = E2/E1 = R1 \cdot R2/T1$. Thus, the ratio r can be changed by appropriately changing R1, R2, and T1.

In the method for manufacturing the semiconductor film M in the laser processing apparatus 1 according to the second embodiment, first, the amorphous semiconductor film M is irradiated with the pulsed laser beam L1 through the first optical path PT1. After that, the semiconductor film M is irradiated with the laser beam L2 through the second optical path PT2 having intensity lower than that of the laser beam L1. By doing so, a waveform similar to the pulse waveform (FIG. 1) of the laser beam unique to the excimer laser is reproduced. Thus, the semiconductor film M having uniform crystal grain size and high crystalline quality can be formed. Further, since a solid-state laser is used in the method for manufacturing the semiconductor film M in the laser processing apparatus 1 according to the second embodiment, maintainability is improved, and running cost can be reduced. Note that a flow of the method for manufacturing the semiconductor film M in the laser processing apparatus 1 is the same as the above-described method for manufacturing the semiconductor film M according to the first embodiment (see FIG. 7), and thus s description thereof will be omitted.

Third Embodiment

<Laser Processing Apparatus According to Third Embodiment>

Next, as a third embodiment, a laser processing apparatus 101 as another laser processing apparatus used in the above-described method for manufacturing the semiconductor film M according to the first embodiment will be described.

Figure 12:
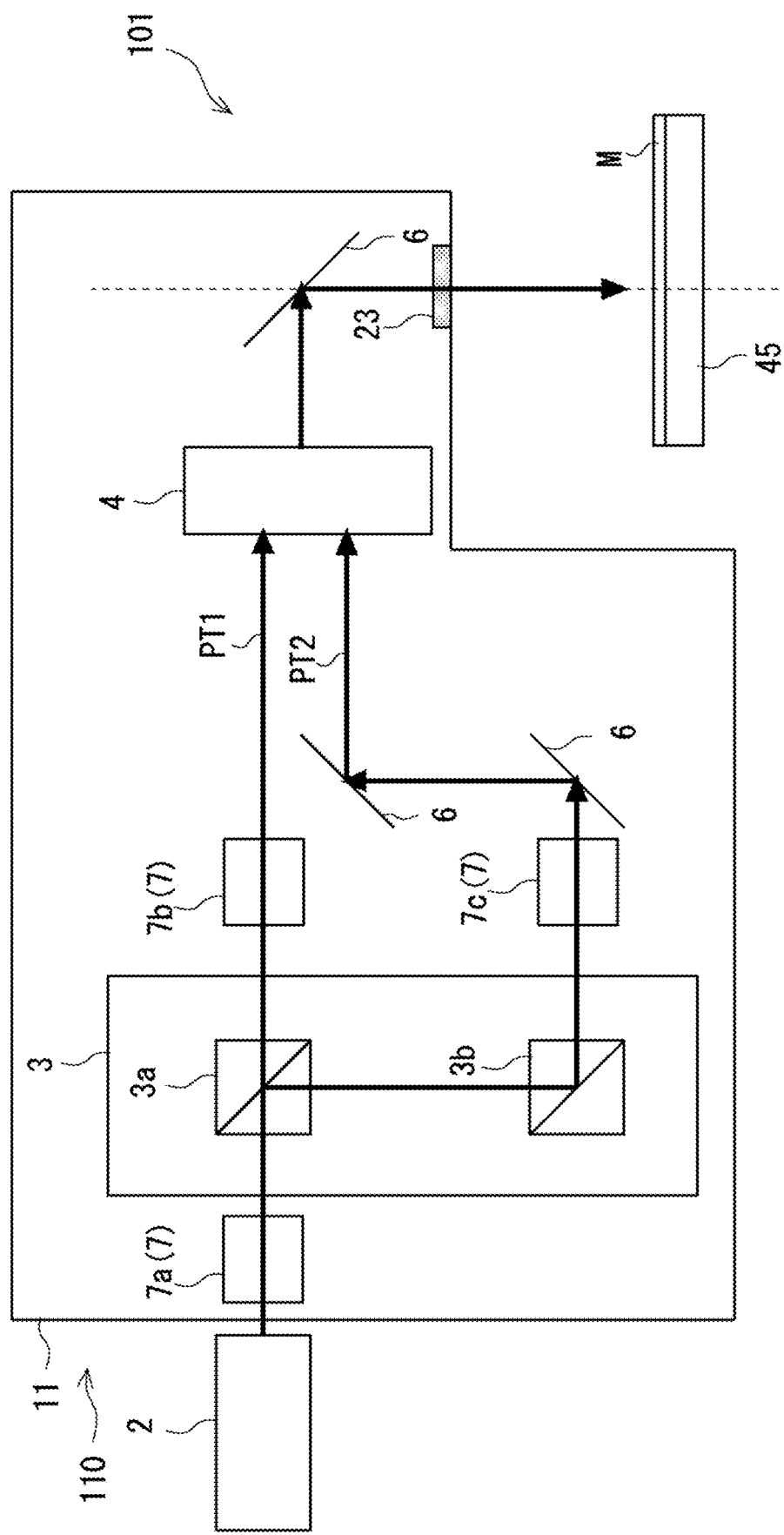
FIG. 12 shows a configuration example of a laser processing apparatus according to a third embodiment.

FIG. 12 shows a configuration example of the laser processing apparatus 101 according to the third embodiment. As shown in FIG. 12, the laser processing apparatus 101 further includes an attenuator 7 for attenuating a laser beam and adjusting the energy to predetermined energy density in addition to the components of the above-described laser processing apparatus 1 according to the second embodiment. That is, an optical system module 110 includes the attenuator 7 as an optical element in addition to the partial reflection mirror 3, the reflection mirror 6, and the homogenizer 4. The attenuator 7 is provided over the optical path between the solid-state laser 2 and the semiconductor film M. That is, the attenuator 7 is disposed over each optical path (first optical path PT1 and second optical path PT2) leading from the first partial reflection mirror 3a and the second partial reflection mirror 3b to the homogenizer 4. The attenuator 7 together with the partial reflection mirror 3 has a role of adjusting the intensity of the laser beam applied to the semiconductor film M. That is, the attenuator 7 and the partial reflection mirror 3 adjust the timing at which the semiconductor film M is irradiated with a laser beam next and adjust the intensity of this laser beam.

Like the above-described laser processing apparatus 1 according to the second embodiment, in the laser processing apparatus 101 according to the third embodiment, when a laser beam is emitted once from the solid-state laser 2, the semiconductor film M is irradiated with laser beams twice at different timings. For example, when the solid-state laser 2 emits a laser beam seven times, the semiconductor film M is irradiated with the laser beams 14 times at different timings. As described above, the semiconductor film M is firstly irradiated with the laser beam (corresponding to the above-described laser beam L1) through the first optical path PT1 having an optical path length longer than that of the second optical path PT2, and then secondly irradiated with the laser beam (corresponding to the above-described laser beam L2) through the second optical path PT2.

Here, when a laser beam having energy density E0 is emitted once from the solid-state laser 2, the energy density of the laser beam (corresponding to the above-described laser beam L1) that reaches the semiconductor film M first is defined as E1, and the energy density of the laser beam (corresponding to the above-mentioned laser beam L2) that reaches the semiconductor film M second is defined as E2. The reflectance of the first partial reflection mirror 3a is defined as R1, the transmittance of the first partial reflection mirror 3a is defined as T1, and the reflectance of the second partial reflection mirror 3b is defined as R2. An attenuation factor of an attenuator 7a is defined as Ta0, an attenuation factor of an attenuator 7b is defined as Ta1, and an attenuation factor of an attenuator 7c is defined as Ta2. Then, E1 and E2 are respectively expressed by the following formulas.

$$E1 = (T1) \cdot Ta1 \cdot (E0) \cdot Ta0$$

$$E2 = (R1 \cdot R2) \cdot Ta2 \cdot (E0) \cdot Ta0$$

From the above formulas, a ratio r of the energy density E2 of the laser beam (corresponding to the above-described laser beam L2) that reaches the semiconductor film M second to the energy density E1 of the laser beam (corresponding to the above-described laser beam L1) of the laser beam that reaches the semiconductor film M first is $r = E2/E1 = (R1 \cdot R2/T1) \cdot (Ta2/Ta1)$. Thus, the ratio r can be changed by appropriately changing R1, R2, T1, Ta1, and Ta2.

In the above-described laser processing apparatus 1 according to the second embodiment, the intensity of the laser beam is adjusted only by changing the transmittance of the partial reflection mirror 3. On the other hand, in the laser processing apparatus 101 according to the third embodiment, the intensity of the laser beam is finely adjusted by the attenuators 7 disposed over the first optical path PT1 and the second optical path PT2 in addition to changing the transmittance of the partial reflection mirror 3. By doing so, it is possible to adjust the intensity of a laser beam more accurately.

Note that the method for manufacturing the semiconductor film M in the laser processing apparatus 101 according to the third embodiment is the same as the above-described method for manufacturing the semiconductor film M in the laser processing apparatus 1 according to the second embodiment, and thus a description thereof is omitted.

Fourth Embodiment

<Laser Processing Apparatus According to Fourth Embodiment>

Next, as a fourth embodiment, a laser processing apparatus 201 as another laser processing apparatus used in the method for manufacturing the semiconductor film M according to the first embodiment will be described.

Figure 13:
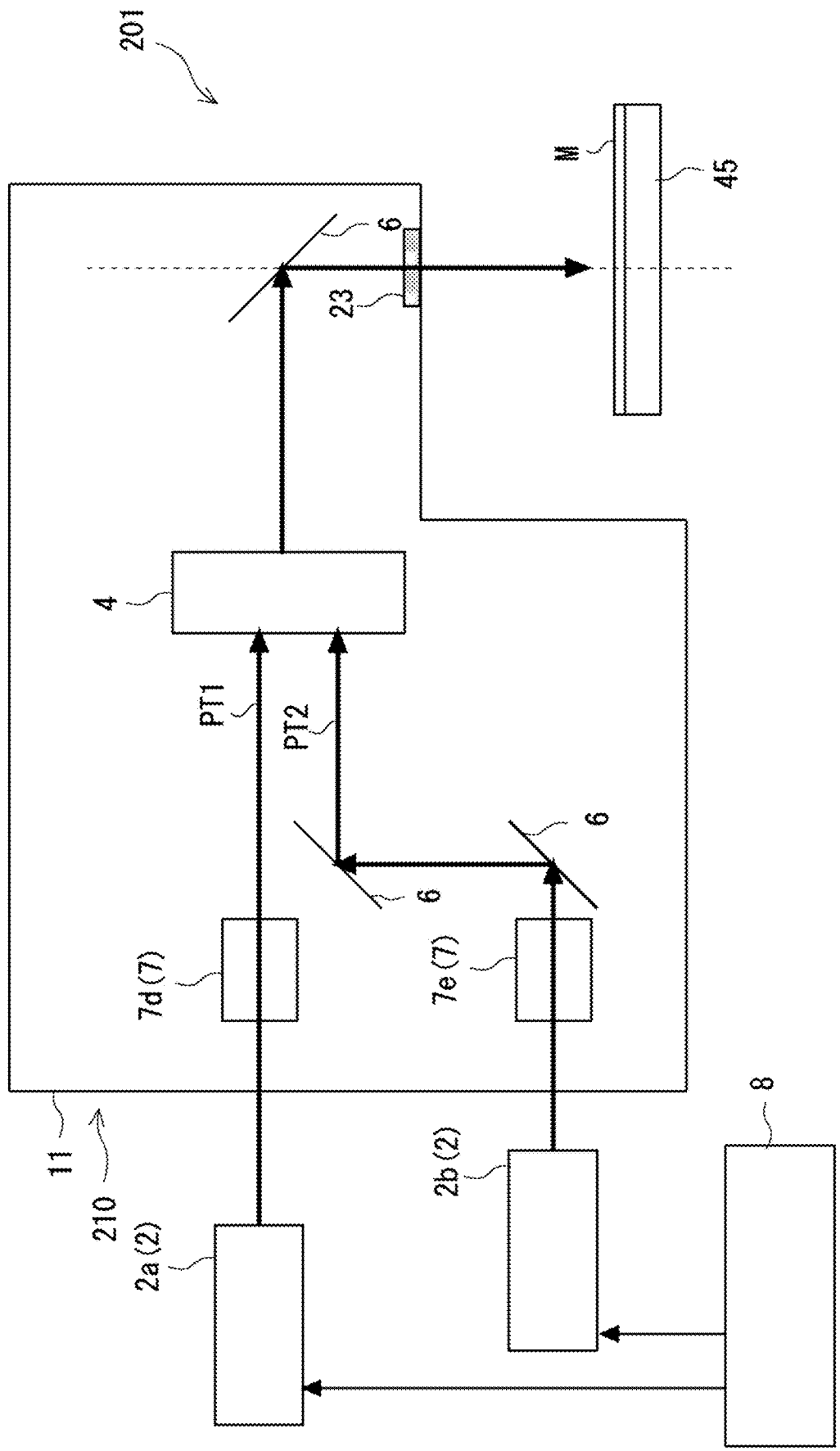
FIG. 13 shows a configuration example of a laser processing apparatus according to a fourth embodiment.

FIG. 13 shows a configuration example of the laser processing apparatus 201 according to the fourth embodiment. In the above-described laser processing apparatus 1 according to the second embodiment, there is a single solid-state laser 2, whereas as shown in FIG. 13, the laser processing apparatus 201 according to the fourth embodiment includes a plurality of solid-state lasers 2 (solid-state lasers 2a and 2b). Further, the laser processing apparatus 201 according to the fourth embodiment further includes a pulse generator 8 for applying laser beams from the plurality of solid-state lasers 2a and 2b with a time difference therebetween. The pulse generator 8 has a role of adjusting the timing of irradiating the semiconductor film M with laser beams.

In the laser processing apparatus 201 according to the fourth embodiment, the laser beam emission timing of each of the solid-state lasers 2a and 2b is adjusted by the pulse generator 8 to thereby adjust an irradiation interval between a time when a laser beam is applied and a time when a laser beam is applied next. Further, the laser processing apparatus 201 according to the fourth embodiment further includes, in an optical system module 210, attenuators 7 for attenuating a laser beam and adjusting the energy to predetermined energy density in addition to optical elements such as the reflection mirror 6 and the homogenizer 4. The attenuators 7 are provided in respective optical paths (first optical path PT1 and second optical path PT2) from the solid-state lasers 2a and 2b to the semiconductor film M. The attenuator 7 has a role of adjusting the intensity of the laser beam applied to the semiconductor film M. That is, the attenuator 7 and the pulse generator 8 adjust the timing at which the semiconductor film M is irradiated with a laser beam next and adjust the intensity of this laser beam. Note that the intensity of the laser beam applied to the semiconductor film M may be adjusted by making the intensity of the laser beams emitted from the solid-state lasers 2a and 2b different from each other.

In the laser processing apparatus 201 according to the fourth embodiment, when each of the solid-state lasers 2a and 2b emits a laser beam once, the semiconductor film M is irradiated with the laser beams twice at different timings. For example, when each of the solid-state lasers 2a and 2b emits a laser beam seven times, the semiconductor film M is irradiated with the laser beams 14 times at different timings. In the laser processing apparatus 201 according to the fourth embodiment, the pulse generator 8 adjusts the laser irradiation in such a way that the semiconductor film M is firstly irradiated with the laser beam (corresponding to the above-described laser beam L1) through the first optical path PT1, and then the semiconductor film M is secondly irradiated with the laser beam (corresponding to the above-described laser beam L2) through the second optical path PT2.

Here, the energy density of the laser beams emitted from the solid-state lasers 2a and 2b is defined as E0, the energy density of the laser beam reaching the semiconductor film M first (corresponding to the above-described laser beam L1) is defined as E1, and the energy density of the laser beam (corresponding to the above-described laser beam L2) that reaches the semiconductor film M second is defined as E2. An attenuation factor of the attenuator 7d is defined as Ta3, and an attenuation factor of the attenuator 7e is defined as Ta4. Then, E1 and E2 are respectively expressed by the following formulas.

$$E1 = Ta3 \cdot E0$$

$$E2 = Ta4 \cdot E0$$

From the above formulas, a ratio r of the energy density E2 of the laser beam (corresponding to the above-described laser beam L2) that reaches the semiconductor film M second to the energy density E1 of the laser beam (corresponding to the above-described laser beam L1) of the laser beam that reaches the semiconductor film M first is $r = E2/E1 = Ta4/Ta3$. Thus, the ratio r can be changed by appropriately changing Ta3 and Ta4. Here, the energy density of the laser beams emitted from the solid-state lasers 2a and 2b are both defined as E0. However, the ratio r can also be changed by making the energy density of the laser beams emitted from the solid-state lasers 2a and 2b different from each other.

When there is only one solid-state laser 2, like in the above-described laser processing apparatus 1 according to the second embodiment, a laser beam emitted from the solid-state laser 2 needs to be divided by an optical system such as the partial reflection mirror 3 so that the divided laser beams pass through plurality of optical paths having different lengths to be applied to the semiconductor film M. On the other hand, in the laser processing apparatus 201 according to the fourth embodiment, the configuration of the optical system can be simpler, and thus the space required for disposing the optical system can be reduced, thereby reducing the apparatus size.

Note that the method for manufacturing the semiconductor film M in the laser processing apparatus 201 according to the fourth embodiment is the same as the above-described method for manufacturing the semiconductor film M in the laser processing apparatus 1 according to the second embodiment, and thus a description thereof is omitted.

Fifth Embodiment

<Laser Annealing Apparatus According to Fifth Embodiment>

Next, as a fifth embodiment, a laser annealing apparatus 301 as another laser processing apparatus used in the method for manufacturing the semiconductor film M according to the first embodiment will be described. The laser annealing apparatus 301 according to the fifth embodiment performs processing for irradiating the semiconductor film M formed over the substrate with a laser beam to crystallize the semiconductor film M.

Figure 14:
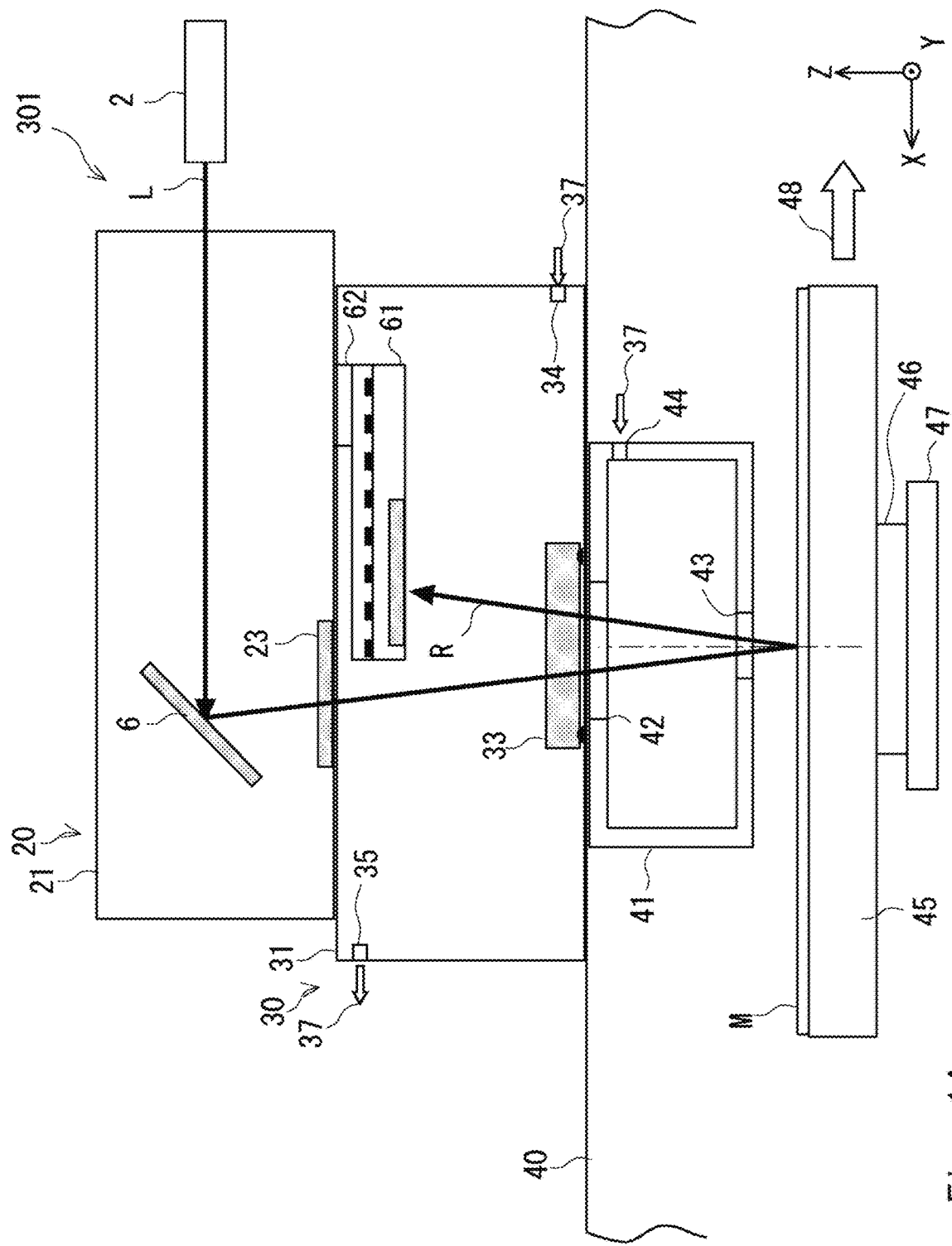
FIG. 14 shows a configuration example of a laser annealing apparatus according to a fifth embodiment.

FIG. 14 shows a configuration example of the laser annealing apparatus 301 according to the fifth embodiment. As shown in FIG. 14, the laser annealing apparatus 301 includes a solid-state laser 2, an optical system module 20, a sealing unit 30, and a processing chamber 40. The processing chamber 40 is provided, for example, over a horizontal base (not shown). The sealing unit 30 is provided above the processing chamber 40, and the optical system module 20 is provided above the sealing unit 30. The optical system module 20 is provided at a position where the optical system module 20 can receive a laser beam L emitted from the solid-state laser 2.

Here, XYZ orthogonal coordinate axes are introduced in order to describe the laser annealing apparatus 301. The direction orthogonal to the upper surface of the horizontal base is defined as a Z-axis direction, an upper direction of the Z-axis direction is defined as a +Z-axis direction, and a lower direction of the Z-axis direction is defined as a −Z-axis direction. The direction connecting the solid-state laser 2 to the optical system module 20 is defined as an X-axis direction, a direction from the solid-state laser 2 toward the optical system module 20 is defined as a +X-axis direction, and a direction opposite to the +X-axis direction is defined as a −X-axis direction. A direction orthogonal to the X-axis direction and the Z-axis direction is defined as a Y-axis direction, one direction of the Y-axis direction is defined as a +Y-axis direction, and a direction opposite to the +Y-axis direction is defined as a −Y-axis direction.

As shown in FIG. 14, the solid-state laser 2 is a laser light source that emits the laser beam L. The solid-state laser 2 is, for example, a YAG laser or a YVO laser. The solid-state laser 2 emits the laser beam L toward the optical system module 20. The laser beam L travels, for example, in the +X-axis direction and enters the optical system module 20.

The optical system module 20 includes an optical system casing 21 that constitutes an outer shape, optical elements such as a reflection mirror 6, and a sealing window 23. The optical system casing 21 is a box-shaped member made of a material such as aluminum. Each optical element of the optical system module 20 is held inside the optical system casing 21 by a holder or the like. With such optical elements, the optical system module 20 adjusts the irradiation direction, the light amount, and the like of the laser beam L emitted from the solid-state laser 2.

The configuration of the above-described optical system module 10 of the laser processing apparatus 1 according to the second embodiment is applied as a configuration of the optical system module 20. The configuration of the above-described optical system module 110 of the laser processing apparatus 101 according to the third embodiment or the above-described configuration of the laser processing apparatus 201 of the optical system module 210 according to the fourth embodiment may be applied as the configuration of the optical module 20.

The sealing window 23 is provided over a part of the optical system casing 21, for example, over a lower surface of the optical system casing 21. After the laser beam L is adjusted by the optical system module 20, the laser beam L is emitted from the sealing window 23 toward the sealing unit 30. In this way, the optical system module 20 irradiates the semiconductor film M with the laser beam L.

Figure 15:
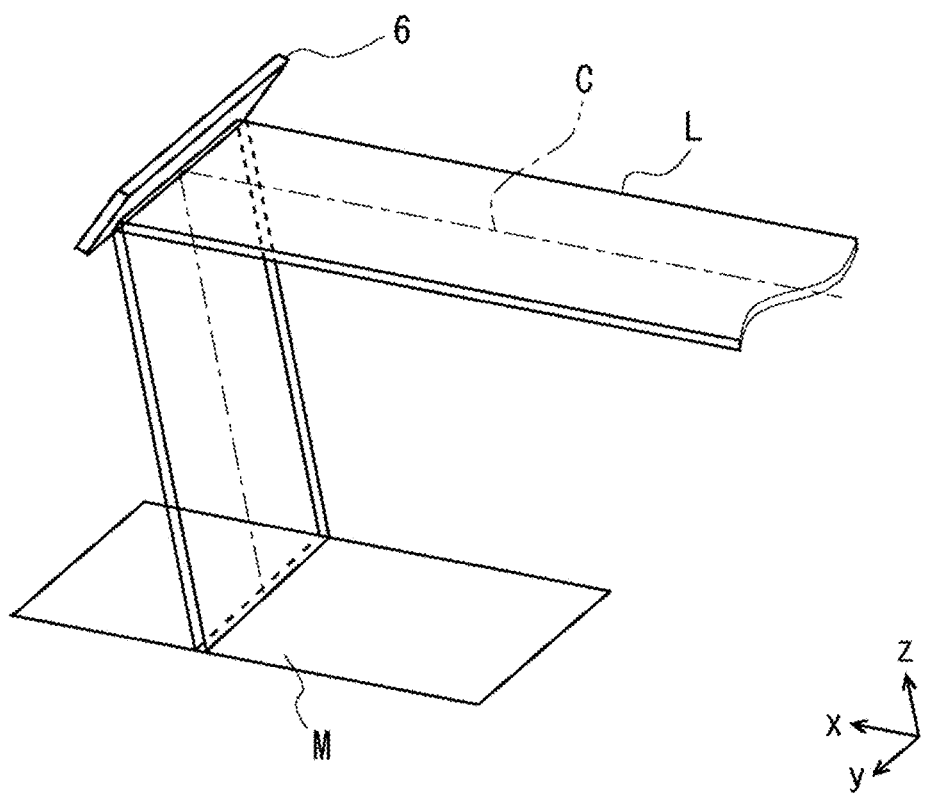
FIG. 15 is a schematic diagram for describing an example of a laser beam applied to a semiconductor film in the laser annealing apparatus according to the fifth embodiment.

FIG. 15 is a schematic diagram showing an example of a laser beam applied to the semiconductor film M. As shown in FIG. 15, the laser beam L has a line beam shape in the optical system module 20. That is, the cross section of the laser beam L orthogonal to an optical axis C is an elongated linear shape extending in one direction. For example, a cross section of the laser beam L orthogonal to the optical axis of the laser beam L reflected by the reflection mirror 6 is a linear shape extending in the Y-axis direction.

As shown in FIG. 14, the sealing unit 30 includes a sealing casing 31, a reflected light receiving member 61, a sealing window 33, a gas inlet 34, and a gas outlet 35.

The sealing casing 31 is a box-shaped member with a hollow inside. Each of the gas inlet 34 and the gas outlet 35 is provided over a predetermined side surface of the sealing casing 31. The gas inlet 34 and the gas outlet 35 are provided, for example, over side surfaces of the sealing casing 31 opposite to each other. For example, the gas outlet 35 is provided above the gas inlet 34. A gas 37, for example, an inert gas such as nitrogen is introduced from the gas inlet 34. The gas 37 introduced inside the sealing casing 31 from the gas inlet 34 is discharged from the gas outlet 35. It is desirable that the gas 37 be continuously supplied inside the sealing casing 31. Further, it is desirable that the gas 37 be continuously discharged to the outside of the sealing casing 31. A flow rate of the gas 37 is controlled to a predetermined flow rate so that the inside of the sealing casing 31 is constantly ventilated.

The reflected light receiving member 61 is disposed inside the sealing casing 31. For example, the reflected light receiving member 61 is disposed outside the optical system module 20 in such a way that the reflected light receiving member 61 is spaced from the optical system module 20. The reflected light receiving member 61 is, for example, a plate-shaped member. The reflected light receiving member 61 is disposed with a plate surface facing the Z-axis direction. The reflected light receiving member 61 is disposed in such a way that it can receive a reflected beam R of the laser beam L reflected to the semiconductor film M. For example, the reflected light receiving member 61 is disposed over the optical path of the reflected beam R in consideration of an incident angle of the laser beam L and a reflection angle of the reflected beam R. Note that the reflected light receiving member 61 may be attached to the optical system module 20 with a heat insulating material 62 and a space therebetween. By doing so, heat insulation between the reflected light receiving member 61 and the optical system module 20 can be maintained.

The sealing window 33 is provided over a part of the sealing casing 31, for example, over a lower surface of the sealing casing 31. The laser beam L emitted from the sealing window 23 of the optical system module 20 is emitted from the sealing window 33 of the sealing unit 30 toward the processing chamber 40.

The processing chamber 40 includes a gas box 41, a substrate stage 45, a substrate base 46, and a scanning apparatus 47. The semiconductor film M is disposed over the substrate stage 45 in a state in which the semiconductor film M is formed over a substrate (not shown). For example, in the processing chamber 40, the semiconductor film M disposed over the substrate stage 45 is irradiated with the laser beam L and then subject to laser annealing processing for crystallizing the semiconductor film M. The substrate stage 45 may be a float type stage, i.e., a stage that transports the substrate over which the semiconductor film M is formed while the substrate is floated.

The gas box 41 is a box-shaped member with a hollow inside. The gas box 41 is disposed above the substrate stage 45 and below the sealing window 33 in the sealing unit 30. An introduction window 42 is provided over an upper surface of the gas box 41. The introduction window 42 is disposed to face the sealing window 33. An irradiation window 43 is provided over a lower surface of the gas box 41. The irradiation window 43 is disposed to face the semiconductor film M.

A gas inlet 44 is provided over a predetermined side surface of the gas box 41. A predetermined gas 37, for example, an inert gas such as nitrogen is supplied to the gas box 41 from the gas inlet 44. After the inside of the gas box 41 is filled with the gas 37 supplied to the gas box 41, the gas 37 is discharged from the irradiation window 43.

The laser beam L incident over the gas box 41 is emitted from the irradiation window 43 and applied to the semiconductor film M. The reflected light receiving member 61 is disposed in such a way that it can receive the reflected beam R reflected by the semiconductor film M of the laser beam L applied to the semiconductor film M.

The substrate stage 45 is disposed over the scanning apparatus 47 with, for example, a substrate base 46 interposed therebetween. The substrate stage 45 can be moved by the scanning apparatus 47 in the X-axis direction, the Y-axis direction, and the Z-axis direction. When the laser annealing processing is performed, the substrate stage 45 is transported by the scanning of the scanning apparatus 47, for example, in a transport direction 48 in the −X-axis direction.

Note that the method for manufacturing the semiconductor film M in the laser annealing apparatus 301 according to the fifth embodiment is the same as the above-described method for manufacturing the semiconductor film M in the laser processing apparatus 1 according to the second embodiment, and thus a description thereof is omitted.

Sixth Embodiment

<Method for Manufacturing Semiconductor Film According to Sixth Embodiment>

Next, as a sixth embodiment, a method for manufacturing a semiconductor apparatus in the above-described laser processing apparatus will be described. In the sixth embodiment, the above-described laser annealing apparatus 301 according to the fifth embodiment is used as a laser processing apparatus. The method for manufacturing a semiconductor apparatus according to the sixth embodiment includes a step of preparing an object to be processed including a substrate and an amorphous semiconductor film formed over the substrate and a step of irradiating the semiconductor film with a laser beam and crystallizing the semiconductor film. As the object to be processed, a substrate over which an amorphous semiconductor film is formed, for example, a glass substrate over which amorphous silicon is formed, is used. In the step of crystallizing the amorphous semiconductor film, laser annealing processing using the above-described laser annealing apparatus 301 according to the fifth embodiment is performed.

The semiconductor apparatus includes a TFT (Thin Film Transistor). In this case, an amorphous silicon film is irradiated with a laser beam and then crystallized, so that a polysilicon film is formed.

FIGS. 16 to 20 are cross-sectional views showing an example of the method for manufacturing a semiconductor apparatus according to the sixth embodiment. The above-described laser annealing apparatus 301 according to the sixth embodiment is suitable for manufacturing a TFT array substrate. Hereinafter, a method for manufacturing a semiconductor apparatus including a TFT will be described.

Figure 16:
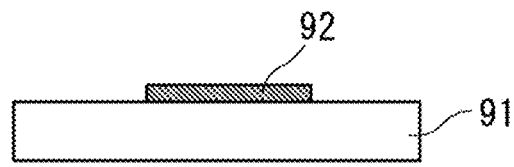
FIG. 16 is a cross-sectional view showing an example of a method for manufacturing a semiconductor apparatus according to a sixth embodiment.
Figure 17:
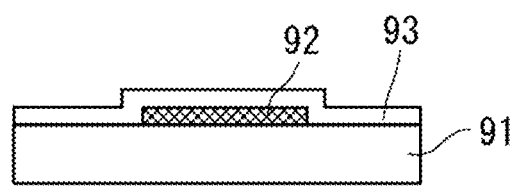
FIG. 17 is a cross-sectional view showing an example of the method for manufacturing a semiconductor apparatus according to the sixth embodiment.
Figure 18:
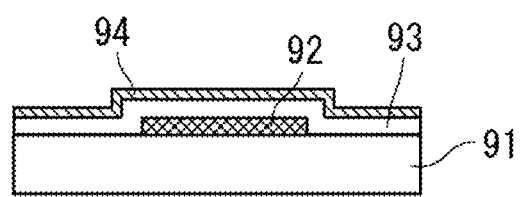
FIG. 18 is a cross-sectional view showing an example of the method for manufacturing a semiconductor apparatus according to the sixth embodiment.

First, as shown in FIG. 16, a gate electrode 92 is formed over a glass substrate 91. For example, a metal thin film containing aluminum or the like can be used as the gate electrode 92. Next, as shown in FIG. 17, a gate insulating film 93 is formed over the gate electrode 92. The gate insulating film 93 is formed to cover the gate electrode 92. After that, as shown in FIG. 18, an amorphous silicon film 94 is formed over the gate insulating film 93. The amorphous silicon film 94 is disposed to overlap the gate electrode 92 with the gate insulating film 93 interposed therebetween. As described above, first, a substrate over which an amorphous semiconductor film is formed is prepared (Step A).

The gate insulating film 93 is a silicon nitride film ($SiN_x$), a silicon oxide film ($SiO_2$ film), or a laminated film of these, etc. Specifically, the gate insulating film 93 and the amorphous silicon film 94 are continuously formed by a CVD (Chemical Vapor Deposition) method. The amorphous silicon film 94 becomes the semiconductor film M in the laser processing apparatus.

Figure 19:
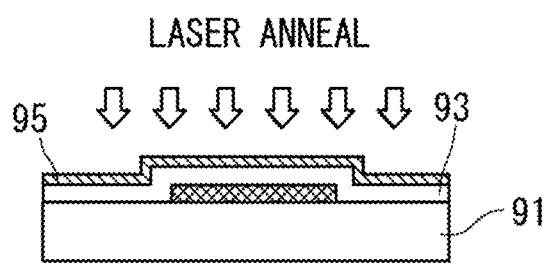
FIG. 19 is a cross-sectional view showing an example of the method for manufacturing a semiconductor apparatus according to the sixth embodiment.

Then, as shown in FIG. 19, the amorphous silicon film 94 is irradiated with a laser beam to crystallize the amorphous silicon film 94 using the above-described laser annealing apparatus 301 according to the fifth embodiment, so that a polysilicon film 95 is formed. For example, a first position control signal for controlling a disposed position of the substrate over the substrate stage 45 is transmitted to a loading/unloading apparatus (not shown) that loads and unloads the substrate (Step B). Then, the substrate is disposed by the loading/unloading apparatus at a first position over the substrate stage 45 determined by the first position control signal (Step C). After that, the substrate is transported over the substrate stage 45 (Step D), and the substrate is irradiated with a laser beam to polycrystallize an amorphous semiconductor film (Step E). After the amorphous semiconductor film is polycrystallized, the substrate is unloaded by the loading/unloading apparatus (Step F).

When all the irradiation areas are not irradiated, a second position control signal is further transmitted to the loading/unloading apparatus (Step G), and the substrate is disposed by the loading/unloading apparatus to a second position different from the first position over the substrate stage 45 determined by the second position control signal (Step H). Then, the substrate is transported to a laser beam irradiation position over the substrate stage 45 (Step I), and the substrate is irradiated with a laser beam (Step J). Then, the polysilicon film 95 in which silicon is crystallized is formed over the gate insulating film 93.

At this time, in the above-described laser annealing apparatus 301 according to the fifth embodiment, first, the pulsed laser beam L1 from the solid-state laser 2 is applied, and after that, the pulsed laser beam L2 having intensity lower than that of the laser beam L1 is applied from the solid-state laser 2. By doing so, a waveform similar to the pulse waveform (FIG. 1) of the laser beam unique to the excimer laser is reproduced. Thus, the semiconductor film M having uniform crystal grain size and high crystalline quality can be formed. Further, since a solid-state laser is used, maintainability is improved, and running cost can be reduced.

After all the irradiation areas are irradiated and the semiconductor film is polycrystallized, the substrate is unloaded by the loading/unloading apparatus (Step K).

Figure 20:
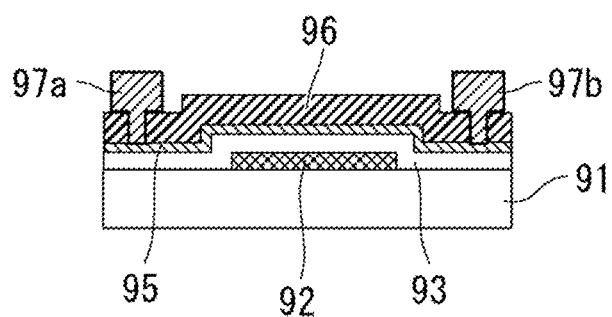
FIG. 20 is a cross-sectional view showing an example of the method for manufacturing a semiconductor apparatus according to the sixth embodiment.

After that, as shown in FIG. 20, an interlayer insulating film 96, a source electrode 97a, and a drain electrode 97b are formed over the polysilicon film 95. The interlayer insulating film 96, the source electrode 97a, and the drain electrode 97b can be formed by using a common photolithography method or film forming method.

A semiconductor apparatus provided with a TFT including a polycrystalline semiconductor film can be manufactured using the method for manufacturing a semiconductor apparatus according to the sixth embodiment. Such a semiconductor apparatus may be used for a screen of a display such as a liquid crystal display. Note that the subsequent manufacturing steps differ depending on the device to be eventually manufactured, and thus the description of the subsequent manufacturing steps will be omitted.

As described above, the disclosure achieved by the inventor has been specifically described based on the embodiments. However, the present disclosure is not limited to the embodiments, and various modifications can be made without departing from the scope of the disclosure, as a matter of course. Further, the configuration in each embodiment may be appropriately exchanged between the embodiments.

The first to sixth embodiments can be combined as desirable by one of ordinary skill in the art.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A method for manufacturing a semiconductor film comprising the steps of:
   (a) irradiating, through a first optical path, an amorphous semiconductor film with a first pulsed laser beam having a first intensity; and then after the step (a),
   (b) irradiating, through a second optical path, the semiconductor film with a second pulsed laser beam having a second intensity, the second intensity of the second pulsed laser beam being lower than the first intensity of the first pulsed laser beam,
   wherein
   the step (b) is performed after a predetermined delay time has elapsed from the step (a),
   the delay time is such that the semiconductor film is irradiated with the second pulsed laser beam before the semiconductor film that melted after it has been irradiated with the first pulsed laser beam film is solidified, and
   the delay time is set by adjusting lengths of the first and second optical paths.

2. The method according to claim 1, wherein
the first pulsed laser beam and the second pulsed laser beam are one of linearly polarized light and circularly polarized light.

3. The method according to claim 1, wherein
one of or both of the first pulsed laser beam and the second pulsed laser beam is/are orthogonal linearly polarized light.

4. The method according to claim 1, further comprising the step of, after the step (b),
   (c) irradiating the semiconductor film with one or more third pulsed laser beams having intensities lower than the first intensity of the first pulsed laser beam.

5. The method according to claim 1, wherein
the first and second pulsed laser beams are obtained by diving a laser beam emitted from a solid-state laser.

6. The method according to claim 5, wherein
the dividing includes transmitting a portion of the laser beam through a first optical device to obtain the first pulsed laser beam, and reflecting a portion of the laser beam by the first optical device to obtain the second pulsed laser beam.

7. The method according to claim 6, wherein
the first and second intensities of the first and second pulsed laser beams are adjusted by adjusting transmittance of the first optical device.

8. The method according to claim 7, wherein
the first optical device includes a first partial reflection mirror and a second partial reflection mirror.

9. The method according to claim 8, wherein
the first and second intensities of the first and second pulsed laser beams are further adjusted using second optical devices positioned in the respective first and second optical paths.

10. The method according to claim 9, wherein
the second optical devices include attenuators.

11. The method according to claim 5, wherein
the solid-state laser is a YAG (Yttrium Aluminum Garnet) laser or a YVO (Yttrium Vanadium Oxide) laser.

12. The method according to claim 1, wherein
the semiconductor film is a silicon film or a germanium film.

13. The method according to claim 1, wherein
the first pulsed laser beam is emitted from a first solid-state laser, and
the second pulsed laser beam is emitted from a second solid-state laser.

14. The method according to claim 13, wherein
the first pulsed laser beam emitted from a first solid-state laser has a first energy, and
the second pulsed laser beam emitted from a second solid-state laser has same first energy as the first pulsed laser beam.

15. The method according to claim 14, wherein
the first and second intensities of the first and second pulsed laser beams are adjusted using optical devices positioned in the respective first and second optical paths.

16. The method according to claim 15, wherein
the optical devices include attenuators, and
the first and second intensities are adjusted by adjusting an attenuation ratio of the attenuators positioned in the first and second optical paths.

17. The method according to claim 13, wherein
each of the first and second solid-state lasers is a YAG (Yttrium Aluminum Garnet) laser or a YVO (Yttrium Vanadium Oxide) laser.

* * * * *